(12) United States Patent  (10) Patent No.: US 6,627,541 B1
Jain                       (45) Date of Patent:    Sep. 30, 2003

(54) REFLOW METHOD FOR CONSTRUCTION OF CONDUCTIVE VIAS

(75) Inventor: Manoj K. Jain, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 90 days.

(21) Appl. No.: 09/697,923

(22) Filed: Oct. 26, 2000

Related U.S. Application Data

(60) Provisional application No. 60/171,079, filed on Dec. 15, 1999.

(51) Int. Cl.$^7$ ................................................ H01L 21/00
(52) U.S. Cl. ........................ 438/646; 438/687; 438/688
(58) Field of Search ................................ 438/643, 632, 438/786, 788, 637, 626, 660, 622, 687, 646, 653

(56) References Cited

U.S. PATENT DOCUMENTS 5,288,665 A  *  2/1994  Nulman ...................... 438/672
5,897,370 A  *  4/1999  Joshi et al. .................. 438/632
6,319,859 B1 * 11/2001  Tran ............................ 438/788
6,399,486 B1 *  6/2002  Chen et al. .................. 438/660

* cited by examiner

*Primary Examiner*—William David Coleman
(74) *Attorney, Agent, or Firm*—Jacqueline J. Garner; W. James Brady, III; Frederick J. Telecky, Jr.

(57) ABSTRACT

A method of constructing a semiconductor device 10 is disclosed which includes a reflow step. The device 10 comprises a conductive via 20 electrically connected to a conductive interconnect 28. The formation of interconnect 28 can result in damage to conductive via 20 including the removal of material within conductive via 20 to form a void 30. The metal reflow step involves heating the structure to a temperature short of the melting point of the conductive material forming the conductive via 20 and the conductive interconnect 28. The reflow step results in the migration of conductive material into the void 30 and a widening of the conductive interface between the conductive via 20 and the conductive interconnect 28.

10 Claims, 1 Drawing Sheet

REFLOW METHOD FOR CONSTRUCTION OF CONDUCTIVE VIAS

This application claims priority under 35 USC § 119(e)(1) of provisional application No. 60/171,079 filed Dec. 15, 1999.

TECHNICAL FIELD OF THE INVENTION

This invention relates in general to the field of electronic devices and more particularly to an improved method utilizing a reflow operation to construct conductive interconnects and vias in a semiconductor device.

BACKGROUND OF THE INVENTION

One of the factors limiting the ability to increase the circuit density of semiconductor devices is the ability to align a conductive body in one layer to points of contact in a previously formed layer as conductive interconnections are made outwardly from the semiconductor substrate surface. Ordinarily, multiple layers of conductive materials such as aluminum, tungsten or copper are formed in layers that are separated from one another by interlevel insulative layers which may comprise, for example, silicon dioxide. The successive layers of conductive material are connected by vertical conductive bodies commonly referred to as vias.

A conductive body in a conductive layer must be aligned with the vias that it is intended to contact. Designers of integrated circuits ordinarily have to include a degree of overlap to ensure that the conductive bodies in a layer completely cover the vias they are intended to contact. This is, in part, due to the problem of "over-etching" into the via itself. If a conductive body does not completely cover the via and the material comprising the via is susceptible to being etched by the chemicals etching the conductive layer, the material within the via can be removed undesirably. If this occurs the conductive capacity of the via will be reduced potentially damaging the operation of the integrated device. However, the overlap that is included as a safety margin reduces the potential density of the integrated device.

SUMMARY OF THE INVENTION

Accordingly, a need has arisen for a method of manufacturing vias and conductive layers within an integrated semiconductor device which allows for maximum device density but addresses the potential harm to the conductive capacity of vias within the structure.

In accordance with the teachings of the present invention, a method of constructing conductive vias and conductive interconnect layers is described which substantially reduces problems associated with prior methods of instruction.

According to one embodiment of the present invention, a method of constructing a semiconductor device is disclosed which comprises a step of forming a conductive via outwardly from the surface of a semiconductor substrate. A conductive interconnect body is then formed outwardly from the conductive via and electrically coupled to the conductive via. The combined structure is then subjected to a reflow heating operation to allow the material within the conductive via and the conductive interconnect to reflow in order to reduce the effect of any over etch of the via during the creation of the conductive interconnect layer.

An important technical advantage of the present invention inheres in the fact that it addresses the potential damage to the conductive via during the creation of the conductive interconnect. This reflow step allows for the conductive properties of the via to be enhanced. Due to the inclusion of this step, the overlap of the interconnect and the via may be reduced thereby increasing the overall density of the integrated device.

BRIEF DESCRIPTION OF THE DRAWINGS

A more complete understanding of the present invention may be acquired by referring to the accompanied figures in which like reference numbers indicate like features and wherein.

DETAILED DESCRIPTION OF THE INVENTION

Figure 1C:
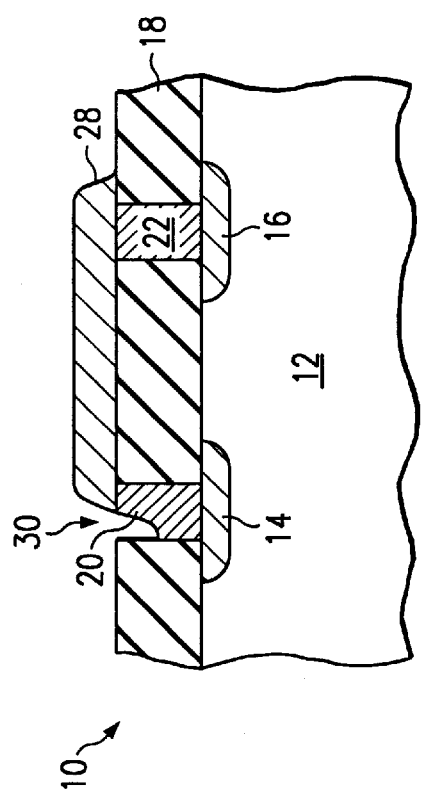
FIGS. 1A through 1C are successive cross-sectional elevational schematic diagrams illustrating one embodiment of the method of the present invention.
Figure 1A:
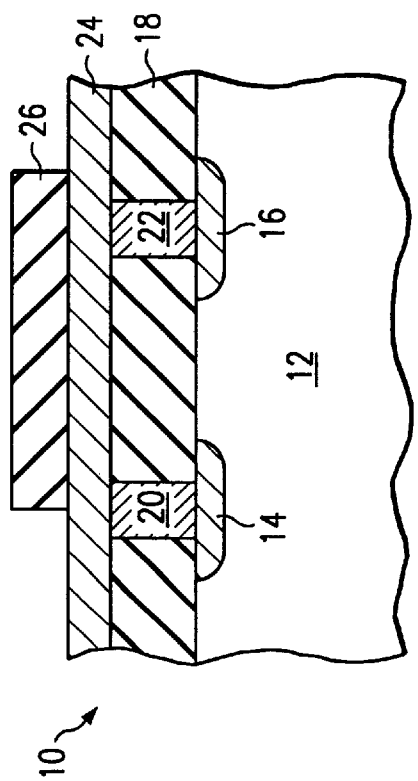

FIG. 1A illustrates a semiconductor device indicated generally at 10 which includes some exemplary structures that will be useful in teaching advantages of the methods of the present invention. Device 10 is formed on an outer surface of a semiconductor substrate 12 which may comprise, for example, a layer of single crystalline or polycrystalline silicon or gallium arsenide. Device 10 comprises a first diffused region 14 and a second diffused region 16. Regions 14 and 16 may comprise areas of the outer surface of substrate 12 which have been implanted with impurities such as boron, phosphorous or arsenic so as to render them conductive.

Device 10 further comprises an interlevel insulator layer 18 which may comprise for example, a layer of silicon dioxide which is grown or deposited to a depth on the order of 5,000 angstroms to one micron in thickness. Using conventional photolithographic techniques, conductive vias 20 and 22 are formed in openings within interlevel insulator layer 18. Vias 20 and 22 may comprise for example, metallic materials such as aluminum, aluminum alloys, copper, or copper alloys.

In order to teach the advantages of the present invention, the steps needed to form an interconnection between via 20 and 22 will be described. It should be understood that the teachings of the present invention are not limited to the structures shown which are solely presented as a convenient way of teaching the advantages of the present invention. First as shown in FIG. 1A, a layer of conductive material 24 is deposited covering the entire outer surface of layer 18 and the outer surfaces of vias 20 and 22. Second, a layer of photoresist 26 is deposited outwardly from layer 24 and patterned and developed resulting in the structure shown in FIG. 1A. A chemical etch step can then be used to remove the portions of layer 24 which are not covered by photoresist layer 26.

As can be seen in FIG. 1A, photoresist layer 26 is not perfectly aligned outwardly from vias 20 and 22. While via 22 is completely covered, via 20 is partially uncovered. This condition may result in a smaller area of connection between via 20 and layer 24 and may result in the unwanted removal of material from via 20 further reducing its conductive properties. This condition is the reason why device designers typically would make photoresist layer 26 large enough so that it would overlap significantly both vias 20 and 22. This overlap allows for a margin of error and helps to prevent the mis-alignment shown in FIG. 1A. However, this substantial overlap reduces the ability of the device designers to put other structures close to the structure 10 shown in FIG. 1A. The overlap therefore reduces the available device density of the overall system. According to the teachings of the present invention, this overlap can be reduced or eliminated because by applying reflow techniques to the resulting structure, the damage due to the exposure of via 20 can be partially or completely repaired.

Figure 1B:
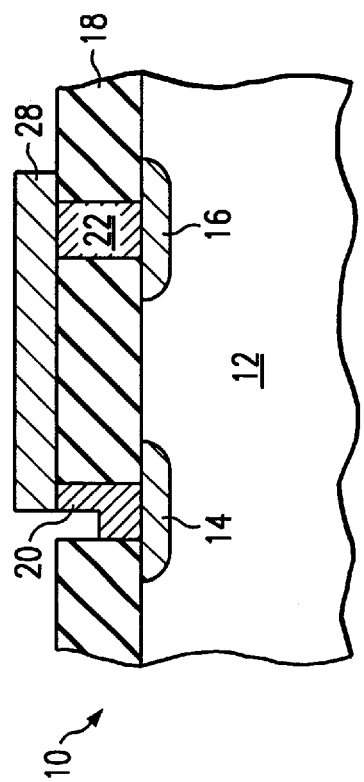

FIG. 1B illustrates the device 10 following the chemical processes used to etch layer 24 to form conductive interconnect 28 shown in FIG. 1B. The photoresist layer 26 has also been stripped from the outer surface of conductive interconnect 28. As discussed previously, the mis-alignment has resulted in the unwanted removal of a portion of conductive via 20 resulting in the creation of a void 30 shown in FIG. 1B. Further, the connective interface between conductive via 20 and conductive interconnect 28 is narrower than desired due to the mis-alignment. The unwanted formation of void 30 is possible because it is typical for conductive interconnect 28 and conductive vias 20 and 22 to be formed of the same material and as such these structures will be susceptible to the same chemical etchants. For example, it is common for conductive vias 20 and 22 and interconnect 28 to all be formed of aluminum, aluminum alloy, copper, or copper alloy. For example, interconnect layer 28 may comprise a layer of aluminum on the order of 3,000 to 7,000 angstroms in thickness.

FIG. 1C illustrates the device 10 following a metal reflow step which is used to repair the unintended damages to via 20. The metal reflow step is accomplished by heating device 10 to a temperature on the order of 350 to 450 degrees Centigrade for on the order of sixty minutes. This temperature is far short of the melting point of aluminum which is about 660 degrees Centigrade. Even in its solid state, however, at the temperatures described, the material comprising conductive via 20 and conductive interconnect 28 will experience material reflow and actual movement of material from interconnect 28 into the void. The migration of material is related to the local surface angle of the material and will therefore cause a smoothing of sharp edges and corners.

Figure 2:
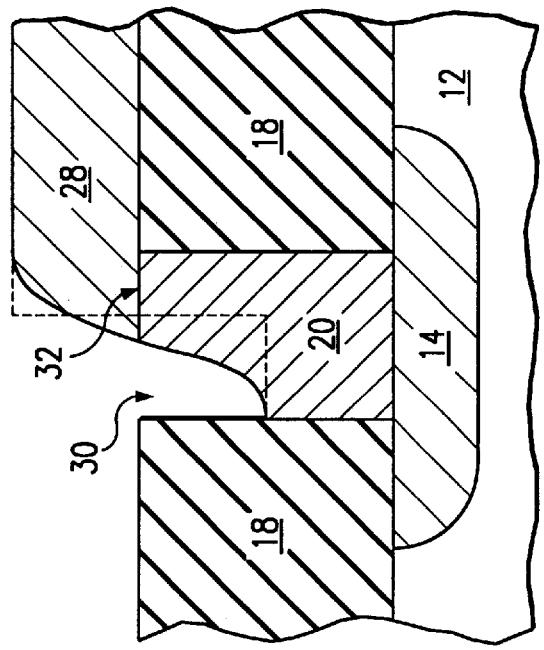
FIG. 2 is a cross-sectional elevational schematic diagram illustrating an enlarged portion of FIGS. 1B and 1C in order to illustrate advantages of the disclosed embodiment of the present invention.

FIG. 2 illustrates the redistribution of material by enlarging the area around conductive via 20. The dotted line in FIG. 2 is the shape of the conductive via 20 and the interconnect layer 28 prior to the reflow operation described. The solid line illustrates the shape following the reflow operation. As shown in FIG. 2, conductive material has partially filled the void 30. In addition, the interface indicated at 32 between conductive via 20 and conductive interconnect 28 has widened due to the movement of material into void 30. This widening will enhance the ability of charge carriers to move between conductive via 20 and conductive interconnect 28. In addition, the softening of the edges of conductive via 20 and conductive interconnect 28 and the widening of interface 32 will greatly reduce problems associated with electro-migration.

Accordingly, through the inclusion of a reflow step, damage to vias due to mis-alignment with interconnect layers being formed outwardly from the vias can be partially or completely repaired. This allows a device designer to reduce the amount of overlap or safety margin when the interconnects are sized and positioned relative to the position of the conductive vias they are intended to contact. The ability to repair the overetch damage to conductive vias also allows a device designer to construct interconnect layers and vias out of the same material without worrying about the damage to the vias from the chemical processes used to form the interconnect layers.

Although the present invention has been described in detail, it should be understood that various changes, alterations, substitutions and modifications may be made to the teachings disclosed herein without departing from the spirit and scope of the present invention which is solely defined by the appended claims.

What is claimed is:

1. A method of constructing a semiconductor device comprising:

forming a conductive via outwardly from an outer surface of a semiconductor layer;

after forming the conductive via, depositing a layer of conductive material outwardly from the conductive via;

etching the conductive material to form a conductive interconnect body in contact with the conductive via; and after etching the conductive material, heating the conductive via and the conductive interconnect to a temperature sufficient to allow for reflow of conductive material within the conductive interconnect and the conductive via such that damage to the conductive via resulting from the step of etching used to form the conductive interconnect may be at least partially repaired by the reflow of conductive material.

2. The method of claim 1 wherein the conductive via and the conductive interconnect comprise aluminum.

3. The method of claim 1 wherein the conductive via and the conductive interconnect comprise copper.

4. The method of claim 1 wherein the conductive via and the conductive interconnect comprise an aluminum alloy.

5. The method of claim 1 wherein the conductive via and the conductive interconnect comprise a copper alloy.

6. The method of claim 1 and further comprising the step of forming an interlevel insulator layer outwardly from the surface of the semiconductor layer, the conductive via formed through the interlevel insulator layer and the conductive interconnect disposed on an outer surface of the interlevel insulator layer.

7. The method of claim 6 wherein the interlevel insulator layer comprises silicon dioxide.

8. The method of claim 1 wherein the metal reflow step results in an enlargement of a conductive interface between the conductive via and the conductive interconnect.

9. A semiconductor device constructed using the method of claim 1.

10. A method of constructing a semiconductor device comprising:

forming an interlevel insulator layer comprising silicon dioxide outwardly from the surface of the semiconductor layer, forming a conductive via comprising aluminum outwardly from an outer surface of a semiconductor layer through the interlevel insulator layer;

after forming the conductive via, depositing a layer of aluminum outwardly from the conductive via on an outer surface of the interlevel insulator layer;

etching the aluminum layer to form a conductive interconnect body in contact with the conductive via; and after etching the aluminum layer, heating the conductive via and the conductive interconnect to a temperature sufficient to allow for reflow of the aluminum material within the conductive interconnect and the conductive via such that damage to the conductive via resulting from the step of etching used to form the conductive interconnect may be at least partially repaired by the reflow of the aluminum material and results in an enlargement of a conductive interface between the conductive via and the conductive interconnect.

* * * * *